United States Patent
Gu et al.

(10) Patent No.: US 10,933,753 B2
(45) Date of Patent: Mar. 2, 2021

(54) SOLAR VEHICLE CARPORT WITH LED SENSOR LIGHT

(71) Applicant: Zhejiang Yotrio Group Co., Ltd., Linhai (CN)

(72) Inventors: Zubin Gu, Linhai (CN); Jianping Xie, Linhai (CN)

(73) Assignee: ZHEJIANG YOTRIO GROUP CO., LTD., Linhai (CN)

( * ) Notice: Subject to any disclaimer, the term of this patent is extended or adjusted under 35 U.S.C. 154(b) by 477 days.

(21) Appl. No.: 15/871,906

(22) Filed: Jan. 15, 2018

(65) Prior Publication Data
US 2019/0217710 A1  Jul. 18, 2019

(51) Int. Cl.
| | |
|---|---|
| *H01L 31/042* | (2014.01) |
| *B60L 8/00* | (2006.01) |
| *B60L 53/16* | (2019.01) |
| *H02S 20/23* | (2014.01) |
| *E04H 6/02* | (2006.01) |
| *B60K 16/00* | (2020.01) |

(52) U.S. Cl.
CPC .............. *B60L 8/003* (2013.01); *B60L 53/16* (2019.02); *E04H 6/025* (2013.01); *H01L 31/042* (2013.01); *H02S 20/23* (2014.12); *B60K 2016/003* (2013.01)

(58) Field of Classification Search
CPC .......... B60L 8/003; B60L 53/16; H02S 20/23; E04H 6/025; H01L 31/042; B60K 2016/003
USPC ........................... 52/173.3, 73, 91.3; 136/251
See application file for complete search history.

(56) References Cited

U.S. PATENT DOCUMENTS

| | | | |
|---|---|---|---|
| 5,109,643 A * | 5/1992 | Speers ...................... | E04B 7/00 52/220.3 |
| 6,901,708 B1 * | 6/2005 | Powers, III .............. | E04B 1/08 52/86 |

(Continued)

FOREIGN PATENT DOCUMENTS

| | | | | |
|---|---|---|---|---|
| EP | 1696087 A1 * | 8/2006 | ............. | F24S 20/67 |
| JP | 08144554 A * | 6/1996 | | |

(Continued)

OTHER PUBLICATIONS

JP 2012-036728 machine translation (Year: 2020).*

*Primary Examiner* — Brent W Herring
(74) *Attorney, Agent, or Firm* — Schwegman Lundberg & Woessner, P.A.

(57) ABSTRACT

A solar vehicle carport with LED sensor light, including a carport top cover, a horizontal pipe assembly, a foot pipe assembly, an LED light module, and a solar receiving module. The horizontal pipe assembly is disposed on two sides of the carport top cover. The foot pipe assembly is engaged with the horizontal pipe assembly to support the carport top cover. The LED light module includes at least one LED light and LED sensor module electrically connected. The solar receiving module is disposed above the carport top cover and electrically connected with the LED light module. The solar vehicle carport with LED sensor light provided by this invention can utilize the solar energy to supply power to the LED light module, which is green and environment friendly. In addition, the LED light is turned on or turned off by a way of sensing, which is energy efficient and humanized.

9 Claims, 5 Drawing Sheets

(56) References Cited

U.S. PATENT DOCUMENTS

| | | | | |
|---|---|---|---|---|
| 8,220,215 B2* | 7/2012 | Ismay | ............... | E04F 13/0871 52/311.1 |
| 8,365,479 B2* | 2/2013 | Tucker | ............... | F24S 25/65 52/173.3 |
| 8,387,318 B2* | 3/2013 | Kaufman | ............... | E04H 6/025 52/173.3 |
| 8,438,809 B2* | 5/2013 | Ismay | ............... | E04F 13/0871 52/311.1 |
| 8,511,007 B2* | 8/2013 | Powers, III | ............... | E04F 10/08 52/173.3 |
| 8,575,887 B1* | 11/2013 | Pomare | ............... | H02J 7/0044 320/101 |
| 9,822,528 B1* | 11/2017 | Greenblatt | ............... | E04D 3/06 |
| 9,963,891 B2* | 5/2018 | Maurus | ............... | B60L 53/30 |
| 10,159,316 B2* | 12/2018 | Gharabegian | ............... | A45B 25/16 |
| 10,428,547 B2* | 10/2019 | McKibben | ............... | H02S 20/23 |
| 10,533,337 B2* | 1/2020 | McKibben | ............... | H02S 20/20 |
| 2010/0275975 A1* | 11/2010 | Monschke | ............... | F24S 25/35 136/251 |
| 2011/0023398 A1* | 2/2011 | Ismay | ............... | E04F 13/0871 52/483.1 |
| 2011/0030285 A1* | 2/2011 | Kaufman | ............... | E04H 6/025 52/82 |
| 2011/0133689 A1* | 6/2011 | Uchihashi | ............... | H02S 40/38 320/101 |
| 2011/0240093 A1* | 10/2011 | Tucker | ............... | F24S 25/12 136/245 |
| 2012/0103391 A1* | 5/2012 | Tucker | ............... | F24S 25/12 136/245 |
| 2012/0216466 A1* | 8/2012 | Powers, III | ............... | F24S 25/40 52/173.3 |
| 2012/0272594 A1* | 11/2012 | Ismay | ............... | E04F 13/0871 52/220.1 |
| 2013/0118099 A1* | 5/2013 | Scanlon | ............... | H02S 20/22 52/173.3 |
| 2014/0216529 A1* | 8/2014 | Tucker | ............... | F24S 25/65 136/251 |
| 2016/0043685 A1* | 2/2016 | MacKler | ............... | H02S 50/10 136/251 |
| 2017/0159306 A1* | 6/2017 | Maurus | ............... | B60L 53/68 |
| 2017/0318921 A1* | 11/2017 | Gharabegian | ............... | H02S 40/38 |
| 2018/0248508 A1* | 8/2018 | Keller | ............... | F24S 25/35 |
| 2019/0169871 A1* | 6/2019 | McKibben | ............... | H02S 20/23 |
| 2019/0200713 A1* | 7/2019 | Gharabegian | ............... | F24S 30/452 |
| 2019/0249412 A1* | 8/2019 | Jackson | ............... | E04B 1/2403 |
| 2019/0383051 A1* | 12/2019 | McKibben | ............... | H02S 20/10 |
| 2020/0036325 A1* | 1/2020 | Poivet | ............... | H02S 30/10 |
| 2020/0115905 A1* | 4/2020 | Jones | ............... | E04D 13/0641 |
| 2020/0115906 A1* | 4/2020 | Jones | ............... | E04D 13/0762 |
| 2020/0115917 A1* | 4/2020 | McKibben | ............... | H02S 20/20 |

FOREIGN PATENT DOCUMENTS

| | | | | |
|---|---|---|---|---|
| JP | 08232490 A | * | 9/1996 | |
| JP | 09221928 A | * | 8/1997 | |
| JP | 10115110 A | * | 5/1998 | |
| JP | 2000179044 A | * | 6/2000 | ............... F24S 20/67 |
| JP | 2006052580 A | * | 2/2006 | |
| JP | 2008038495 A | * | 2/2008 | |
| JP | 2012036728 A | * | 2/2012 | |
| JP | 2015089991 A | * | 5/2015 | |

* cited by examiner

SOLAR VEHICLE CARPORT WITH LED SENSOR LIGHT

BACKGROUND OF THE INVENTION

Field of the Invention

This invention relates to an awning, and more particularly, to a solar vehicle carport with an LED sensor light.

Description of the Related Art

A carport belongs to awning products, the carport is a simple and efficient device that can prevent the car from the summer sunlight exposure, which is favored widely for a long time. In the last dozen years, with the improvement of people's living standard, there are more and more cars, the demand for carport is growing, and the requirement of hommization is getting higher. However, in the past, in the market, most clients used a simple fabric carport which cannot meet the hommization needs of the clients. Choices of customers on the carport products are also one-sided, shading is the only evaluation criteria in the market in most cases, and there are many problems when using the carport; in addition, as the installation method for the existing carport is complicate, the expected sunshade effect will not be achieved once the installation is improper.

Particularly, when the car is parking under the carport in the evening, after people getting out of the car, there is usually no lighting or it needs to manually turn on the switch so that the lights shine, which is very inconvenient.

SUMMARY OF THE INVENTION

To overcome at least one disadvantage of the prior art, this invention provides a solar vehicle carport with an LED sensor light.

To achieve the purpose above, this invention provides a solar vehicle carport with an LED sensor light, including a carport top cover, a horizontal pipe assembly, a foot pipe assembly, an LED light module, and a solar receiving module. The horizontal pipe assembly is disposed at two sides of the carport top cover. The foot pipe assembly is engaged with the horizontal pipe assembly to support the carport top cover. The LED light module includes at least one LED light and LED sensor module electrically connected. The solar receiving module is disposed above the carport top cover and electrically connected with the LED light and LED sensor module.

In an embodiment of the invention, the carport top cover may include a polycarbonate sunsheet (PC sunsheet), side top pipes and top pipes. The side top pipes and top pipes may have clamping grooves, respectively, and the PC sunsheet may engage with the side top pipes and top pipes through the clamping grooves.

In an embodiment of the invention, the carport top cover may further include stopper pieces respectively fixed at two sides of the side top pipes and top pipes to stop the PC sunsheet.

In an embodiment of the invention, the solar vehicle carport with the LED sensor light may further include a support assembly, and the carport top cover may be fixed with the horizontal pipe assembly and the foot pipe assembly through the support assembly.

In an embodiment of the invention, the support assembly may include a lateral triangle support piece and an equilateral triangle support piece engaging with each other. Two sides of the lateral triangle support piece may fix the carport top cover and the foot pipe assembly, respectively, and two sides of the equilateral triangle support piece may fix the horizontal pipe assembly and the foot pipe assembly, respectively.

In an embodiment of the invention, the LED sensor module may include an object-sensitive optic-controlled module, which electrically connects with at least one LED light.

In an embodiment of the invention, the LED sensor module may further include a sensor power switch to turn on or turn off the LED sensor module.

In an embodiment of the invention, the solar receiving module may be detachably fixed at the top.

In an embodiment of the invention, the foot pipe assembly may include a plurality of foot pipes, and a step is disposed at one end of each foot pipes to carry part of the horizontal pipe assembly.

In conclusion, the solar vehicle carport with the LED sensor light provided by this invention can utilize the solar energy to supply power to the LED light module, which is green and environment friendly. In addition, the LED light is to turned on or turned off by a way of sensing, which is energy efficient and humanized.

In particular, when cars or people get close to the carport in the evening, the LED sensor module sends a sensing signal within a preset distance, and thus the LED light shines; and in daytime, the LED light is not turned on, and meanwhile customers can select to turn on or turn off the main power switch of the LED sensor module to start the LED light to work or cut off the power supply to stop working. The design is more diverse and humanized.

The carport is an arc-shaped carport top cover, and the PC sunsheet is inserted into the clamping groove of the arc top pipe to directly clamp closely. It is convenient to assemble differing from the trim strip method connected by screws on the market in which the assembly is complicated.

The whole frame of the carport is stable, and the top pipes, horizontal pipes and foot pipes are engaged with each other by neighboring support pieces. The operation is simple, and the assembly is convenient, which ensures the stability of the carport body.

The solar receiving module is disposed above the carport top cover, the built-in battery can be disassembled and replaced independently, and the whole solar receiving module can be taken out and put indoor to be charged.

In order to make the above-mentioned and other objectives, features and advantages of the invention be clearly understood, descriptions in detain are as follow with preferable embodiments below and accompany drawings.

DETAILED DESCRIPTION OF THE INVENTION

Figure 1:
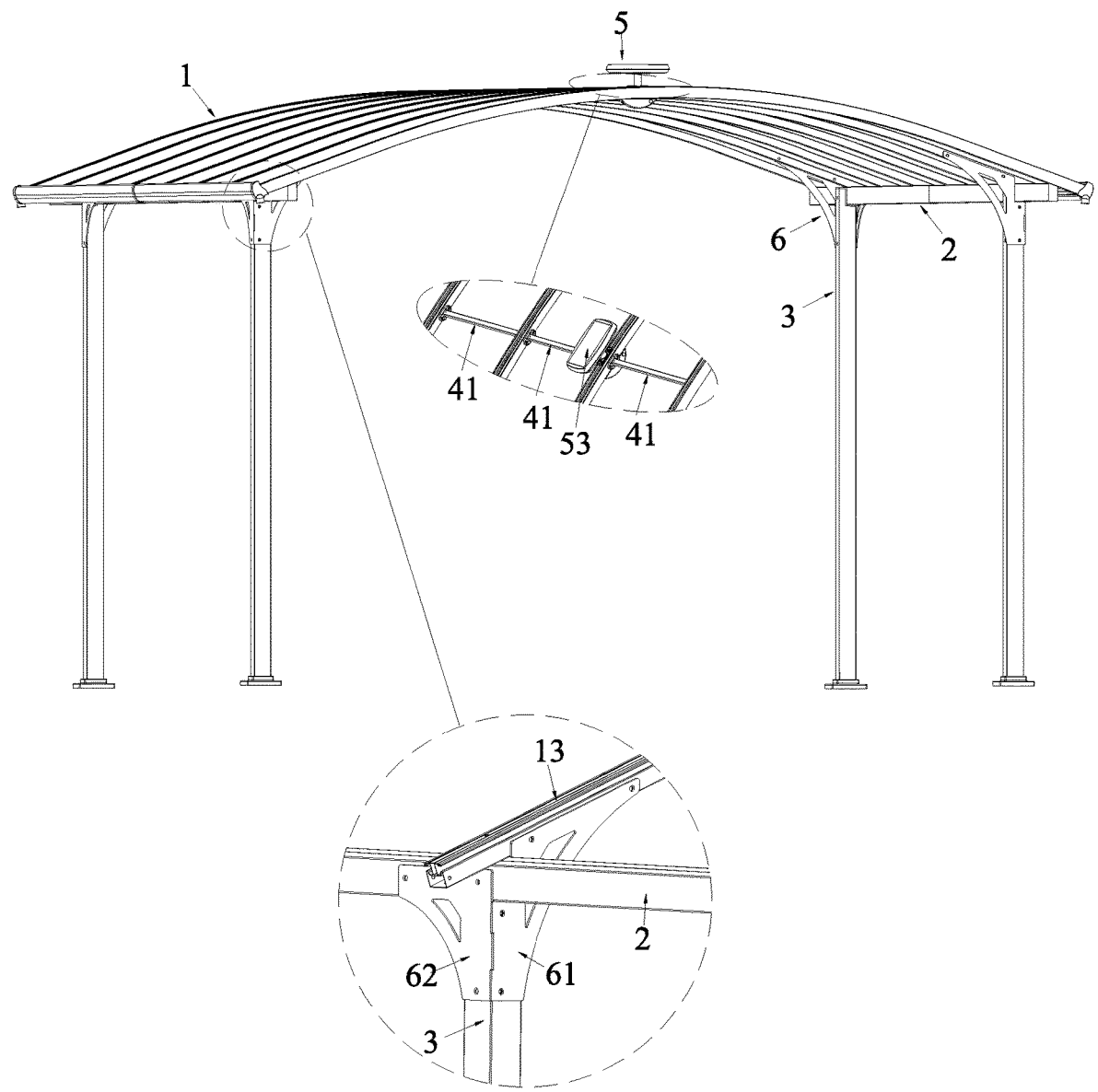
FIG. 1 is a schematic diagram of a solar vehicle carport with an LED sensor light according to an embodiment of this invention.
Figure 2:
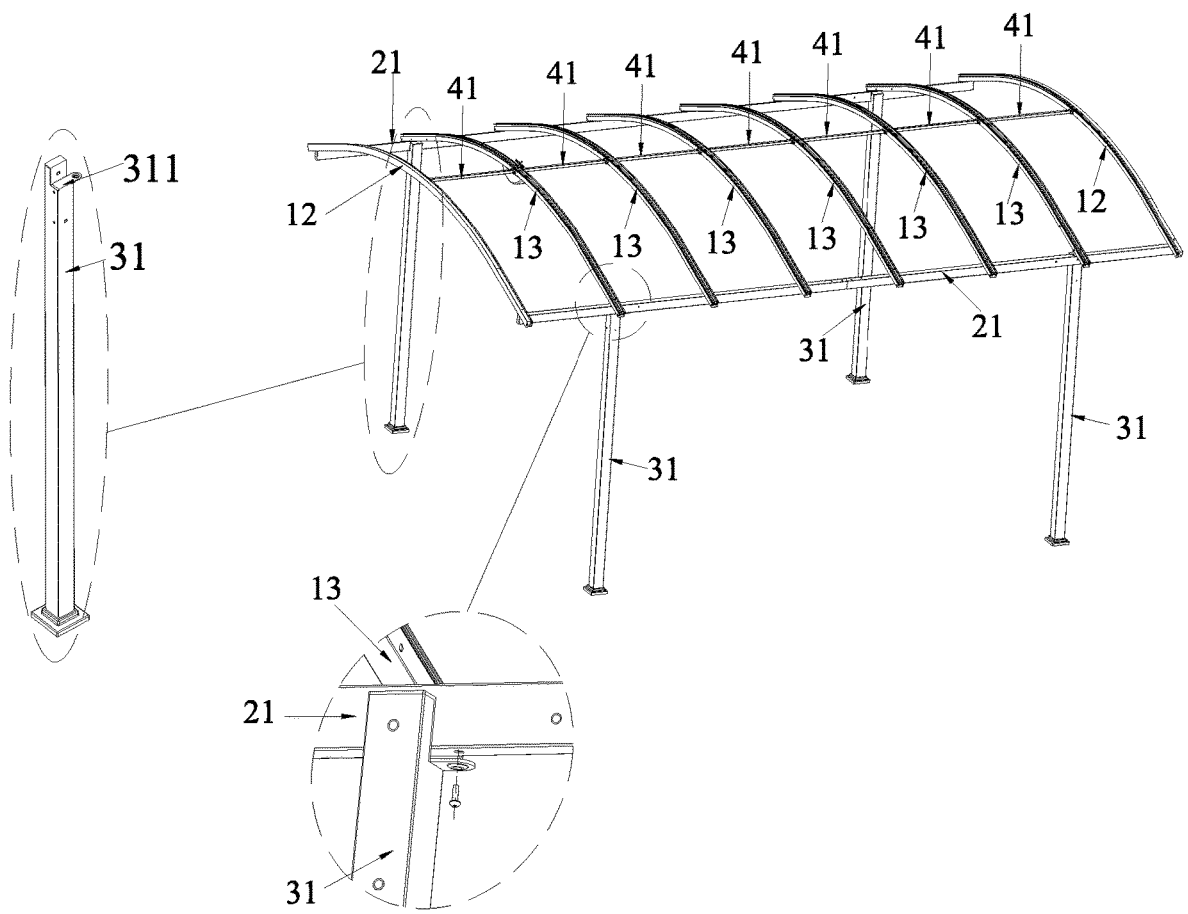
FIG. 2 is a schematic diagram of a solar vehicle carport with the LED sensor light in an assembly process according to an embodiment of this invention.
Figure 3:
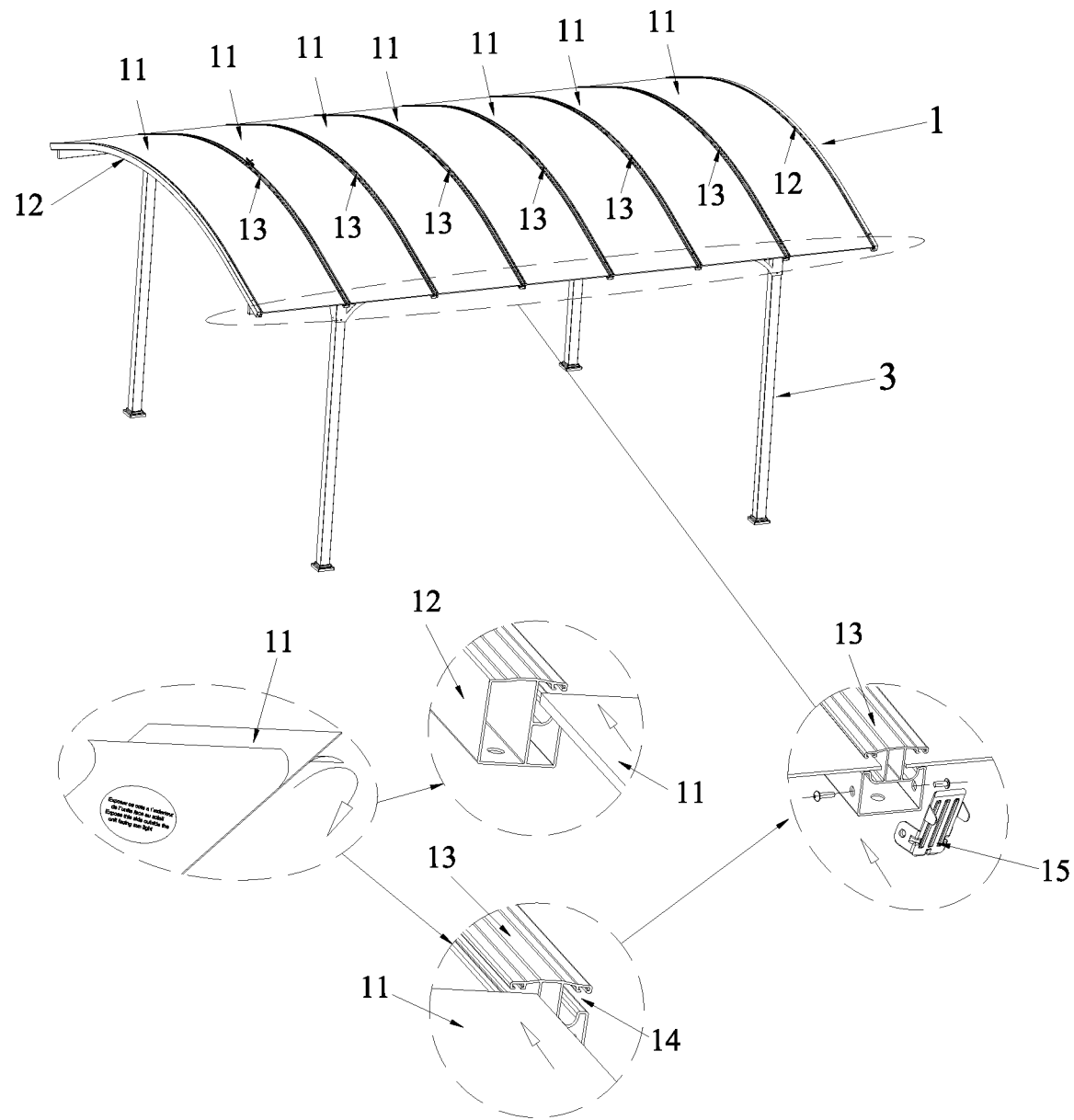
FIG. 3 is a schematic diagram of a solar vehicle carport with the LED sensor light for further assembly in FIG. 2.
Figure 4:
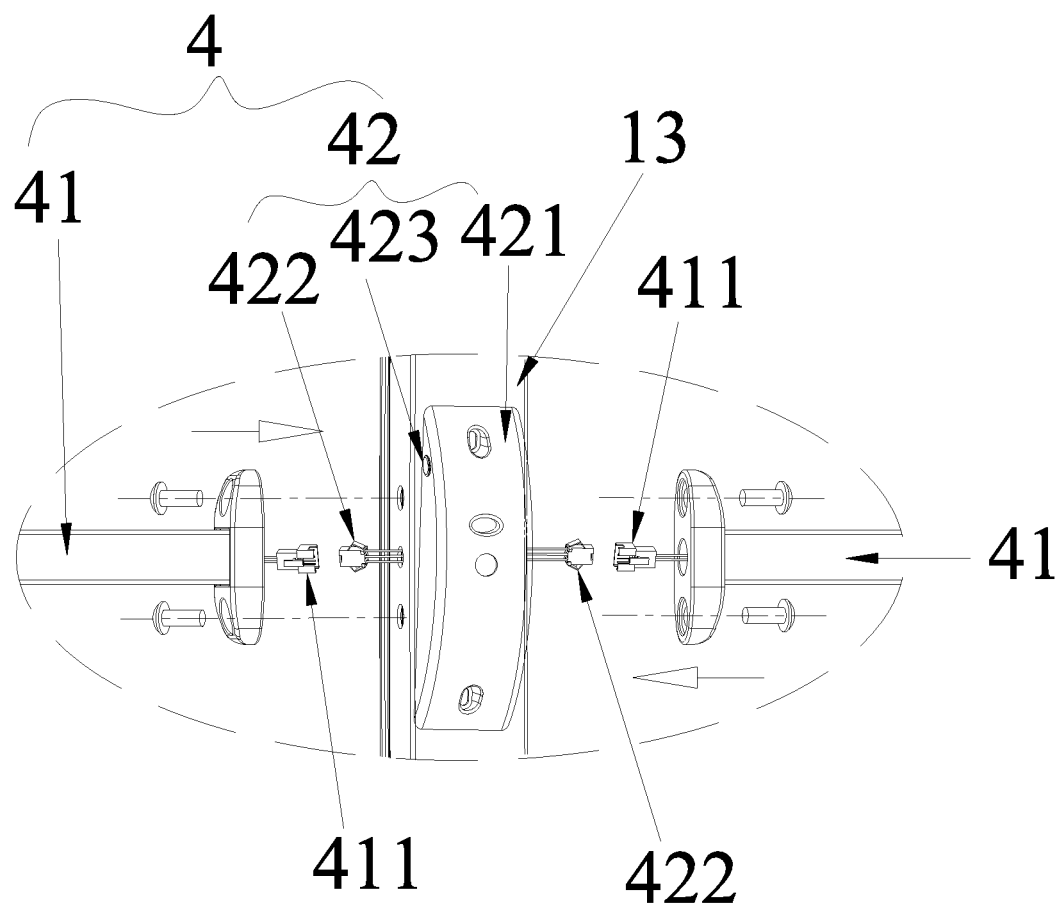
FIG. 4 is a partial assembly schematic diagram of a solar vehicle carport with the LED sensor light according to an embodiment of this invention.
Figure 5:
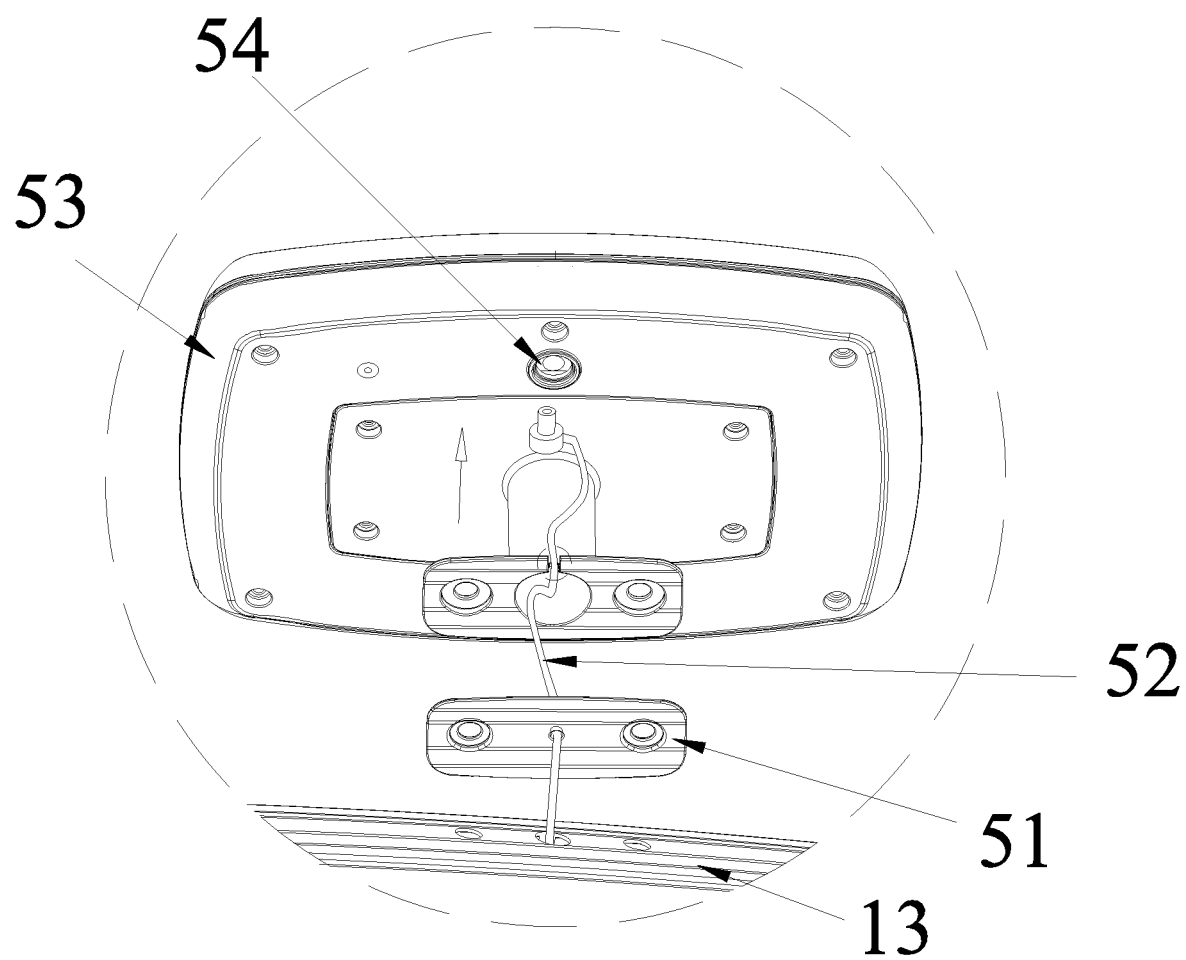
FIG. 5 is a partial exploded diagram of a solar receiving module according to an embodiment of this invention.

This invention provides a solar vehicle carport with an LED sensor light, including a carport top cover 1, a horizontal pipe assembly 2, a foot pipe assembly 3, an LED light module 4, and a solar receiving module 5. The horizontal pipe assembly 2 is disposed at two sides of the carport top cover 1. The foot pipe assembly 3 is engaged with the horizontal pipe assembly 2 to support the carport top cover 1. The LED light module 4 includes at least one LED light 41 and LED sensor module 42 electrically connected. The solar receiving module 5 is disposed above the carport top cover 1 and electrically connected with the LED light module 4.

The carport top cover includes a polycarbonate sheet (PC sunsheet) 11, two side top pipes 12 and a plurality of top pipes 13. The PC sunsheet is a transparent panel, which can reduce the ultraviolet radiation and resist part of the solar heat. The carport top cover 1 made by the PC sunsheets 11 shelter from the summer sun and rain, meanwhile it can make the strong sunlight reflect into the awning by a way of diffused light, so that the light ray in the awning is bright but not blinding. and it does not affect the outside landscape of the awning seen from inside of the awning, which overcomes the defects brought by the opaque of the existing fabric canopy.

The side top pipes 12 and the top pipes 13 are connected with the corresponding LED lights 41 at two sides, respectively. A plurality of strip particle LED chips are disposed in each LED lights. The top pipes 13 make the circuit pass through a way of opening a hole.

The side top pipes 12 and the top pipes 13 have clamping grooves 14, respectively, the PC sunsheet 11 can be inserted into the clamping grooves 14 and be clamped between two neighboring top pipes 13 and between the side top pipes 12 and the top pipe 13 by a way of sliding. By this assembly way, the assembly is simple and convenient, which solves the defect that the assembly is complicated through the trim strip way connected by screws in the prior art. The side top pipes 12 can adopt the same structure with the top pipes 13. That is, both sides have the clamping grooves 14, which standardizes the elements during manufacture and increases the production efficiency. The side top pipes 12 can also adopt different structure with the top pipes 13. That is, both sides of the top pipes 13 have the clamping grooves 14, and the side top pipes 12 can only have the clamping grooves 14 at one side. This invention makes no limit for that.

In this embodiment, the carport top cover 1 further includes a plurality of stopper pieces 15 respectively fixed at two sides of the side top pipes 12 and the top pipes 13 to stop the PC sunsheet 11 from slipping out of the clamping grooves 14. The stopper pieces 15 can be fixedly connected with the side top pipes 12 and the top pipes 13 by a bolt.

In this embodiment, the horizontal pipe assembly 2 includes two horizontal pipes 21, and the foot pipe assembly 3 includes four foot pipes 31. However, this invention makes no limit for the numbers of horizontal pipe 21 and foot pipe 31. In other embodiments, the horizontal pipe assembly 2 can include three horizontal pipes, and the foot pipe assembly 3 can only include two or six foot pipes. A step 311 is disposed at one end of each foot pipes 31 to carry part of the horizontal pipe 21, and screw holes are disposed on the step 311 to fix the foot pipe 31 and the horizontal pipe 21 by threads.

In this embodiment, the solar vehicle carport with the LED sensor light further includes a support assembly 6, and the carport top cover 1 is fixed with the horizontal pipe assembly 2 and the foot pipe assembly 3 through the support assembly 6. The support assembly 6, the horizontal pipe assembly 2 and the foot pipe assembly 3 are fastened by screws.

In this embodiment, the support assembly 6 can include a lateral triangle support piece 61 and an equilateral triangle support piece 62 engaged with each other. The two sides of the lateral triangle support piece 61 fix the carport top cover 1 and the foot pipe assembly 3, respectively, and the two sides of the equilateral triangle support piece 62 fix the horizontal pipe assembly 2 and the foot pipe assembly 3, respectively. Specifically, the lower end of the equilateral triangle support piece 62 is fixed at one side of the upper end of the foot pipe assembly 3 by screws, and the lower end of the lateral triangle support piece 61 is fixed at the other side of the upper end of the foot pipe assembly 3 by screws (vertical to the side fixed by the equilateral triangle support piece 62). The lateral triangle support piece 61 and the equilateral triangle support piece 62 are engaged with each other and form a 90-degrees angle, and the lateral triangle support piece 61 has one gap. The horizontal pipe assembly 2 crosses the gap to be fixed, and is carried at the step 311 of the foot pipe assembly 3. The upper end of the equilateral triangle support piece 62 is reinforced with the horizontal pipe assembly 2 by screws. The top pipe 13 is disposed on the horizontal pipe assembly 2, and the two are fixed by screws. The upper end of the lateral triangle support piece 61 is reinforced with the top pipe 13 by screws.

In conclusion, the carport top cover 1 is close to the horizontal pipe assembly 2 fastened by screws; and the horizontal pipe assembly 2 is close to the upper end port of the foot pipe assembly 3, the top pipe 13, the foot pipe assembly 3 and the horizontal pipe assembly 2 are engaged with each other by the lateral triangle support piece 61 and the equilateral triangle support piece 62 and fastened by screws, the operation of the assembly way is simple, and the assembly is convenient, which ensures the stability of the carport body.

In this embodiment, the LED sensor module 42 includes a sensor assembly 421 on the top pipe 13, a sensor wire connector 422 and a sensor power switch 423. The light wire connector 411 of the LED light 41 is electrically connected with the sensor wire connector 422, then the light wire connector 411 of the LED light 41 crosses over the top pipe 13 and is connected with the light wire connector of the neighboring LED light end to end by turns. The connector is hidden in the top pipe 13. Two ends of the LED light 41 is close to the top pipe 13 and fastened by screws. By this setting way, all the wires have no leak, the wiring is more reasonable, and the harm to the wires by other objected is avoided.

The solar receiving module 5 further includes a solar energy base gasket 51, a solar receiving module cable 52 and a photovoltaic panel 53. An DC inner jack 54 is disposed at the lower cover of the photovoltaic panel 53 on the solar receiving module 5, and the solar receiver cable plug of the LED light 41 can be inserted into the DC inner jack 54, such that the LED light 41 is electrically connect with the solar receiving module 5, and the detachably installation of the solar receiving module 5 is achieved.

A built-in battery is disposed in the solar receiving module 5 and can be disassembled and replaced independently. The solar receiving module 5 is detachably disposed at the carport top cover 1. When there's no sun, the whole solar receiving module can be taken out and put indoor to be charged, thereby overcoming the limitation of the weather to the solar receiving module 5, and ensuring the solar receiving module 5 to supply the power for the LED sensor module 42 everyday.

In this embodiment, the LED sensor module 42 is an object-sensitive optic-controlled module, which is electrically connected with at least one LED light 41. First the optic-controlled module senses whether it's daytime or night. When the object-sensitive optic-controlled module senses that the light is lower than a threshold value, it is judged to be night, then the object-sensitive optic-controlled module senses that something is getting close to the carport, such as a car or a person. Within a preset distance, the LED sensor module 42 can send a sensing signal, and the LED light 41 shines. When the object-sensitive optic-controlled module senses that no object is getting close to the carport, the LED light 41 won't shine. When the object-sensitive optic-controlled module senses and judges to be daytime, the LED light 41 won't be turned on whether cars or people are getting close or not. In addition, customers can select to turn on or turn off the sensor power switch 423 of the LED sensor module 42 to start the LED light to work or cut off the power supply to stop working, and the design is more diverse and humanized. However, this invention makes no limit for the type of the LED sensor module 42. Any LED sensor module which can achieve the same function is within the scope of protection of this invention. In other embodiments, the LED sensor module 42 can be a audio-controlled optic-controlled module or an infrared optic-controlled module. When it's detected to be night, and when a voice or heat source is getting close within a preset distance, the LED light shines.

In conclusion, the solar vehicle carport with the LED sensor light provided by this invention can utilize the solar energy to supply power to the LED light module, which is green and environment friendly. In addition, the LED light is to turned on or turned off by a way of sensing, which is energy efficient and humanized.

In particular, when cars or people get close to the carport in the evening, the LED sensor module sends a sensing signal within a preset distance, and thus the LED light shines; and in daytime, the LED light is not turned on, and meanwhile customers can select to turn on or turn off the main power switch of the LED sensor module to start the LED light to work or cut off the power supply to stop working. The design is more diverse and humanized.

The carport of this invention is an arc-shaped carport top cover, and the PC sunsheet is inserted into the clamping groove of the arc top pipe to directly clamp closely. It is convenient to assemble differing from the trim strip method connected by screws on the market in which the assembly is complicated. The whole frame of the carport is stable, and the top pipes, horizontal pipes and foot pipes are engaged with each other by neighboring support pieces. The operation is simple, and the assembly is convenient, which ensures the stability of the carport body. The solar receiving module is disposed above the carport top cover, the built-in battery can be disassembled and replaced independently, and the whole solar receiving module can be taken out and put indoor to be charged.

Although the present invention has been described in considerable detail with reference to certain preferred embodiments thereof, the disclosure is not for limiting the scope of the invention. Persons having ordinary skill in the art may make various modifications and changes without departing from the scope and spirit of the invention. Therefore, the scope of the appended claims should not be limited to the description of the preferred embodiments described above.

What is claimed is:

1. A solar vehicle carport with an LED sensor light, comprising:
   an arc-shaped carport top cover, comprising top pipes;
   a horizontal pipe assembly, disposed at two sides of the carport top cover;
   a foot pipe assembly, engaged with the horizontal pipe assembly to support the carport top cover;
   an LED light module, comprising at least one LED light and LED sensor module electrically connected; and
   a solar receiving module, disposed above the carport top cover and electrically connected with the LED light and LED sensor module;
   wherein the solar vehicle carport with the LED sensor light further comprises a support assembly, and the carport top cover is fixed with the horizontal pipe assembly and the foot pipe assembly through the support assembly;
   wherein the support assembly comprises a side-disposed triangle support piece and a front-disposed triangle support piece engaging relative to the side-disposed triangle support piece, two sides of the side-disposed triangle support piece fix the carport top cover and the foot pipe assembly, respectively, and two sides of the front-disposed triangle support piece relative to the side-disposed triangle support piece fix the horizontal pipe assembly and the foot pipe assembly, respectively;
   wherein the side-disposed triangle support piece has a gap, the horizontal pipe assembly crosses the gap to be fixed, the horizontal pipe assembly is carried at the step of the foot pipe assembly; an upper end of the front-disposed triangle support piece relative to the side-disposed triangle support piece is reinforced with the horizontal pipe assembly by screws; each top pipe is disposed on the horizontal pipe assembly and the top pipe and the horizontal pipe assembly are fixed by screws, an upper end of the side-disposed triangle support piece is reinforced with one top pipe by screws.

2. The solar vehicle carport with the LED sensor light according to claim 1, wherein the carport top cover comprises a polycarbonate (PC) sunsheet and side top pipes, the top pipes and the side top pipes have clamping grooves, respectively, and the PC sunsheet is engaged with the side top pipes and the top pipes through the clamping grooves.

3. The solar vehicle carport with the LED sensor light according to claim 2, wherein the carport top cover further comprises stopper pieces respectively fixed at the two sides of the side top pipes and the top pipes to stop the PC sunsheet.

4. The solar vehicle carport with the LED sensor light according to claim 2, wherein the foot pipe assembly comprises a plurality of foot pipes, and a step is disposed at one end of each foot pipes to carry part of the horizontal pipe assembly.

5. The solar vehicle carport with the LED sensor light according to claim 2, wherein the LED sensor module comprises a sensor assembly on the top pipes, a sensor wire connector and a sensor power switch;
   a light wire connector of the at least one LED light is electrically connected with the sensor wire connector, the light wire connector of at least one LED light crosses over the top pipes and the light wire connector is connected with the light wire connector of the neighboring LED light end to end by turns, and the connector is hidden inside the top pipes.

6. The solar vehicle carport with the LED sensor light according to claim 1, wherein the LED sensor module is an object-sensitive optic-controlled module and is electrically connected with at least one LED light.

7. The solar vehicle carport with the LED sensor light according to claim 1, wherein the LED sensor module further comprises a sensor power switch to turn on or turn off the LED sensor module.

8. The solar vehicle carport with the LED sensor light according to claim 1, wherein the solar receiving module is detachably fixed at the carport top cover.

9. The solar vehicle carport with the LED sensor light according to claim 1, wherein the solar receiving module further comprises a solar energy base gasket, a solar receiving module cable and a photovoltaic panel; an DC inner jack is disposed at a lower cover of the photovoltaic panel on the solar receiving module, and a solar receiver cable plug of the LED light can be inserted into the DC inner jack, such that the LED light is electrically connect with the solar receiving module, and a detachably installation of the solar receiving module is achieved.

* * * * *